(12) United States Patent
Kar et al.

(10) Patent No.: US 12,418,303 B2
(45) Date of Patent: Sep. 16, 2025

(54) ANALOG-TO-DIGITAL CONVERSION WITH BIT SKIPPING FUNCTIONALITY

(71) Applicant: International Business Machines Corporation, Armonk, NY (US)

(72) Inventors: Monodeep Kar, New York, NY (US);
Ankur Agrawal, Chappaqua, NY (US);
Mingu Kang, Old Tappan, NJ (US);
Kyu-Hyoun Kim, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 919 days.

(21) Appl. No.: 17/406,704

(22) Filed: Aug. 19, 2021

(65) Prior Publication Data
US 2023/0058641 A1    Feb. 23, 2023

(51) Int. Cl.
*H03M 1/34* (2006.01)
*H03M 1/38* (2006.01)

(52) U.S. Cl.
CPC .................................... *H03M 1/38* (2013.01)

(58) Field of Classification Search
CPC ........ H03M 1/38; H03M 1/462; H03M 1/466; G06F 17/16
USPC ......................................................... 341/161
See application file for complete search history.

(56) References Cited

U.S. PATENT DOCUMENTS

| | | | |
|---|---|---|---|
| 9,473,164 B1 | 10/2016 | Chen et al. | |
| 9,621,177 B1 * | 4/2017 | Jun | H03M 1/1033 |
| 9,985,640 B1 | 5/2018 | Wen et al. | |
| 10,447,292 B1 | 10/2019 | Price | |
| 10,476,487 B2 | 11/2019 | Roy et al. | |
| 10,664,271 B2 | 5/2020 | Muralimanohar et al. | |
| 11,038,520 B1 * | 6/2021 | Narayanan | H03M 1/1019 |
| 11,157,237 B2 * | 10/2021 | Muralimanohar | G11C 13/0002 |
| 2014/0139365 A1 | 5/2014 | Vun et al. | |
| 2015/0263751 A1 | 9/2015 | Sato | |
| 2019/0149162 A1 | 5/2019 | Lin et al. | |
| 2019/0296760 A1 | 9/2019 | Kim et al. | |
| 2020/0204187 A1 | 6/2020 | Hong et al. | |
| 2020/0272893 A1 * | 8/2020 | Danial | G06N 3/02 |
| 2020/0356847 A1 | 11/2020 | Yi et al. | |

(Continued)

FOREIGN PATENT DOCUMENTS

| CN | 101232287 A | 7/2008 |
|---|---|---|
| DE | 102018219313 A1 | 5/2020 |

(Continued)

OTHER PUBLICATIONS

Taiwan Office Action Application No. 11220076280, Oct. 11, 2022, 7 pages.

(Continued)

*Primary Examiner* — Jean B Jeanglaude
(74) *Attorney, Agent, or Firm* — Kimberly Zillig; Ryan, Mason & Lewis, LLP

(57) ABSTRACT

Techniques for performing analog-to-digital conversion are described. For example, a method performs an analog-to-digital conversion of an analog input to a digital output including a set of bits, the set of bits including a most significant bit and one or more additional bits, the analog-to-digital conversion starting at a given one of the one or more additional bits following the most significant bit.

24 Claims, 15 Drawing Sheets

(56) References Cited

U.S. PATENT DOCUMENTS

2021/0397932 A1* 12/2021 Yudanov ............... G06N 3/063

FOREIGN PATENT DOCUMENTS

TW    201246800 A1    11/2012
WO    2020/257531 A1    12/2020

OTHER PUBLICATIONS

P. Mell et al., "The NIST Definition of Cloud Computing," Recommendations of the National Institute of Standards and Technology, Special Publication 800-145, Sep. 2011, 7 pages.

U.S. Appl. No. 17/012,916, filed Sep. 4, 2020, and entitled "Integer Matrix Multiplication Based on Mixed Signal Circuits."

International Searching Authority, Notification of Transmittal of the International Search Report and the Written Opinion of the International Searching Authority, Nov. 11, 2022, 10 pages, International Application No. PCT/IB2022/057209.

* cited by examiner

$$\sum_{i=1}^{63} X_i W_i = \sum_{i=1}^{63} (8x_{i3} + 4x_{i2} + 2x_{i1} + x_{i0})(8w_{i3} + 4w_{i2} + 2w_{i1} + w_{i0})$$

$$= \sum_{i=1}^{63} (x_{i0}w_{i0} + 2x_{i0}w_{i1} + 2x_{i1}w_{i0} + \cdots + 64x_{i3}w_{i3})$$

$$= \boxed{\sum_{i=1}^{63} x_{i0}w_{i0}} + 2\boxed{\sum_{i=1}^{63} x_{i0}w_{i1}} + 2\boxed{\sum_{i=1}^{63} x_{i1}w_{i0}} + \cdots + 64\boxed{\sum_{i=1}^{63} x_{i3}w_{i3}}$$

| X [1:0] \ W [1:0] | 00 | 01 | 10 | 11 |
|---|---|---|---|---|
| 00 | 0 | 0 | 0 | 0 |
| 01 | 0 | 1 | 0 | 1 |
| 10 | 0 | 0 | 1 | 2 |
| 11 | 0 | 1 | 2 | 2 |

$P(\sum X.W = 0) = 9/16$
$P(\sum X.W = 1) = 1/4$
$P(\sum X.W = 2) = 3/16$
$P(\sum X.W \leq 1) = 13/16$

FIG. 5C
520

| EVENT ($y = \sum X.W$) | $0 < y \leq 1$ | $1 < y \leq 2$ | $2 < y \leq 4$ | $4 < y \leq 8$ | $8 < y \leq 16$ | $16 < y \leq 32$ | $32 < y \leq 64$ |
|---|---|---|---|---|---|---|---|
| PROBABILITY | 0.000000 | 0.000000 | 0.000019 | 0.004262 | 0.448321 | 0.547387 | 0.000011 |

600

700

$$ADC\ CYCLES = \begin{cases} N - 1 \\ n + N, \\ 1 \leq n \leq N - 1, \end{cases}$$

$2^N$ TERMS DOT-PRODUCT ENGINE
$n$ IS NUMBER OF BITS FROM $(MSB-1)^{th}$ POSITION AFTER WHICH COMPUTATION IS RESTARTED

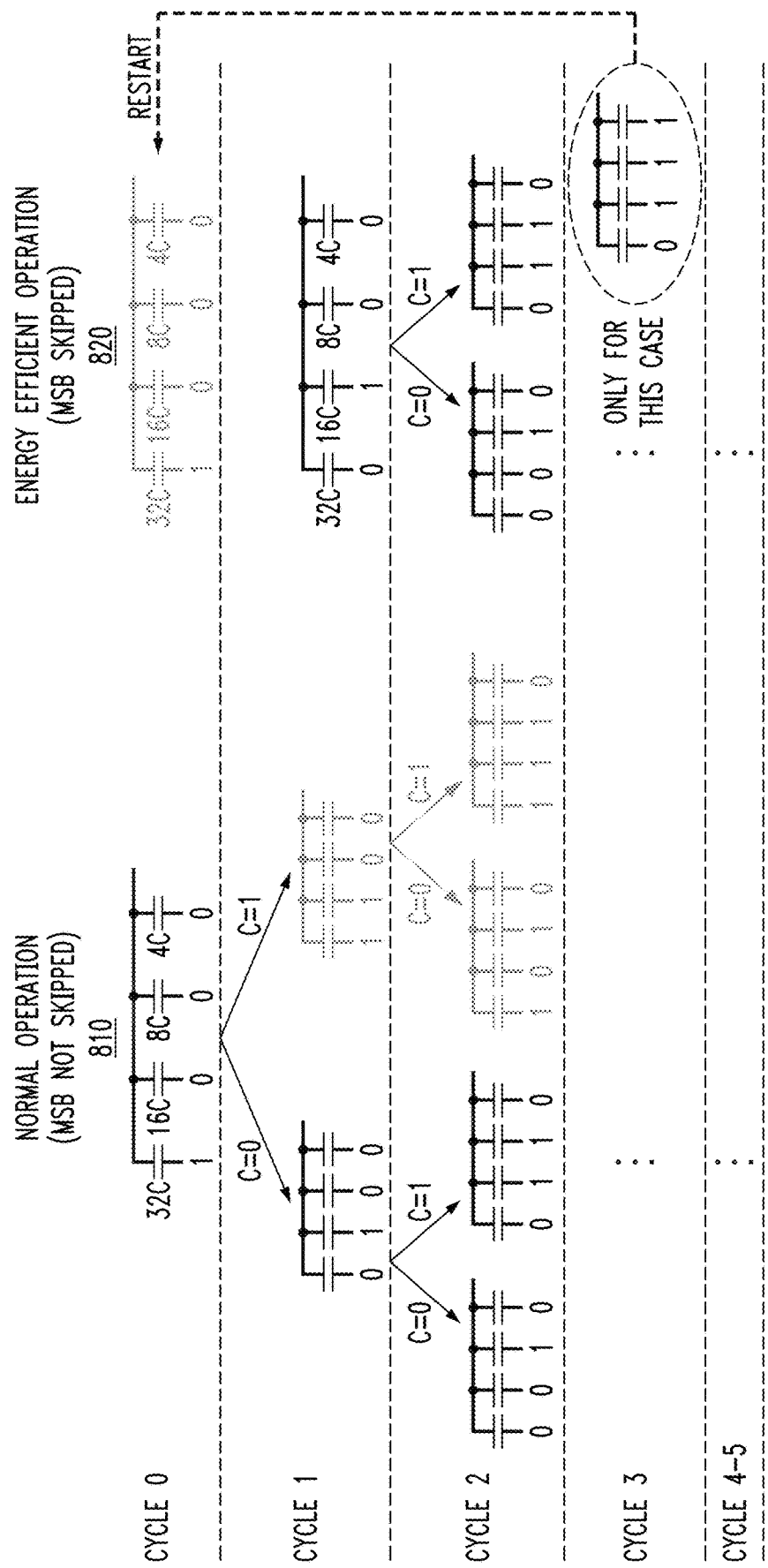

910

900

1000

ANALOG-TO-DIGITAL CONVERSION WITH BIT SKIPPING FUNCTIONALITY

BACKGROUND

The field relates to analog-to-digital conversion (ADC) and, more particularly, to ADC in mixed signal circuitry such as, but not limited to, multiply-accumulate (MAC) circuits used for neural network models. Mixed signal circuitry operates in both an analog signal domain and a digital signal domain. Accordingly, ADC is typically needed to perform at least some computations. However, ADC conversion energy can be a limiting factor in mixed signal circuit designs.

SUMMARY

Embodiments of the invention provide improved techniques for performing analog-to-digital conversion computations such as, for example, in mixed signal circuitry configured to execute neural network models.

In one embodiment, an apparatus comprises at least one processor and at least one memory including instruction code. The at least one memory and the instruction code are configured to, with the at least one processor, cause the apparatus at least to perform an analog-to-digital conversion of an analog input to a digital output comprising a set of bits, the set of bits comprising a most significant bit and one or more additional bits, the analog-to-digital conversion starting at a given one of the one or more additional bits following the most significant bit.

In another embodiment, a method comprises the step of performing an analog-to-digital conversion of an analog input to a digital output comprising a set of bits, the set of bits comprising a most significant bit and one or more additional bits, the analog-to-digital conversion starting at a given one of the one or more additional bits following the most significant bit. The method is executed by processing circuitry configured to execute instruction code.

In yet another embodiment, an article of manufacture comprises a non-transitory computer-readable storage medium having embodied therein executable instruction code that when executed by a processor causes the processor to perform the step of performing an analog-to-digital conversion of an analog input to a digital output comprising a set of bits, the set of bits comprising a most significant bit and one or more additional bits, the analog-to-digital conversion starting at a given one of the one or more additional bits following the most significant bit.

In a further embodiment, a system comprises a dot-product summation computation unit configured to perform binary multiplication of first and second vectors, a successive approximation register analog-to-digital converter unit configured to convert an analog output of the dot-product summation computation unit to a digital output comprising a set of bits, the set of bits comprising a most significant bit and one or more additional bits, and controller logic operatively coupled to the successive approximation register analog-to-digital converter unit, the controller logic being configured to determine values of the set of bits of the digital output based at least in part on a comparison of an output of the dot-product summation computation unit and a sequence of weighted binary codes. The sequence of weighted binary codes starts from a given one of the one or more additional bits following the most significant bit.

In an additional embodiment, a device comprises dot-product summation circuitry configured to output a first signal, the first signal comprising a dot-product sum of binary multiplication of first and second vectors, and a successive approximation register analog-to-digital converter configured to perform conversion of the first signal output by the dot-product summation circuitry to a digital output comprising a set of bits, the set of bits comprising a most significant bit and one or more additional bits. The successive approximation register analog-to-digital converter comprises successive approximation register controller circuitry configured to output a second signal and comparator circuitry comprising a first input node coupled to the dot-product summation circuitry, a second input node coupled to the successive approximation register controller circuitry, and an output node configured to provide an output value based at least in part on a comparison of the first value output by the dot-product summation circuitry and the second value output by the successive approximation register controller circuitry. The successive approximation register controller circuitry is configured to determine values of the set of bits of the digital output based at least in part on output values of the comparator circuitry produced as a sequence of weighted binary codes is output as the second signal. The sequence of weighted binary codes starts from a given one of the one or more additional bits following the most significant bit.

These and other features and advantages of embodiments described herein will become more apparent from the accompanying drawings and the following detailed description.

BRIEF DESCRIPTION OF THE DRAWINGS

FIG. 4 depicts an algebraic representation associated with of a dot product computation with which one or more illustrative embodiments can be implemented.

FIGS. 5A through 5C depict dot product statistics utilized according to illustrative embodiments.

FIG. 8 depicts a cycle flow to demonstrate error tolerance associated with implementing most-significant bit skipping in a dot product engine according to an illustrative embodiment.

DETAILED DESCRIPTION

Figure 1:
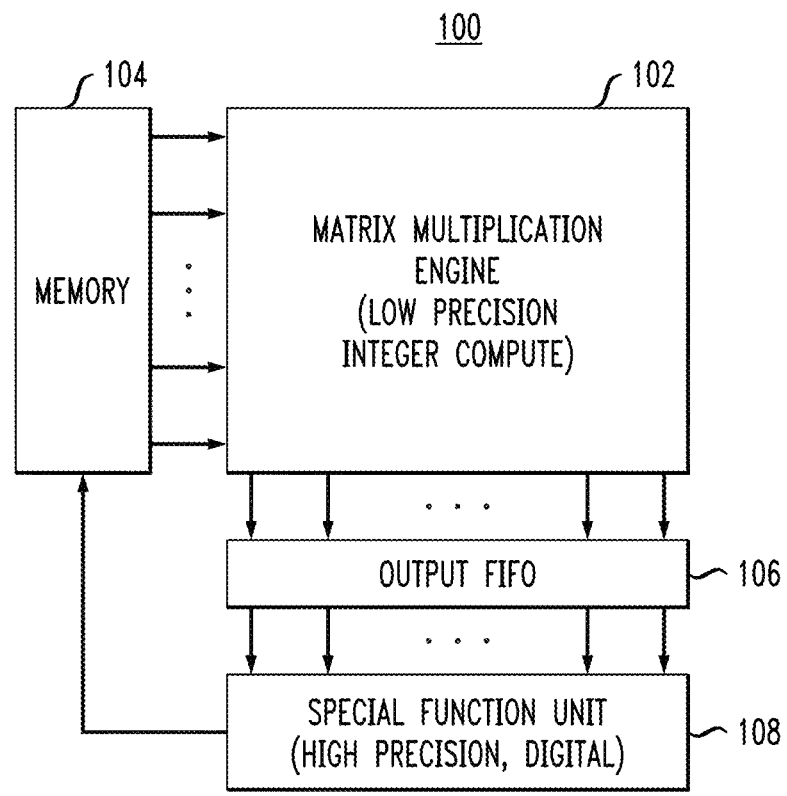
FIGS. 1A and 1B respectively depict a neural network accelerator and a mathematical representation of computations performed therein with which one or more illustrative embodiments can be implemented.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Further, it is to be understood that the phrase "configured to" as used in conjunction with a circuit (the term "circuitry" may be used interchangeably herein), structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, logic gates, etc.), programmable elements, processing devices, one or more integrated circuits and/or other types of circuitry, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, integrated circuits and/or other types of circuitry that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

A neural network model is one of the most widely used types of machine learning (ML) algorithms in artificial intelligence systems. For example, a neural network model can be used to recognize underlying relationships and/or patterns in a set of data through a process that mimics the manner in which the human brain operates. The neural network model is first trained using a training data set (training stage), and then the trained neural network model is used to recognize relationships and/or patterns in a target data set (inference stage).

Many workloads that execute a neural network model require a large number of matrix multiplications which typically involve multiply-accumulate (MAC) operations. It is realized that accumulate operations are generally energy-inefficient when performed in the digital signal domain, but much more energy-efficient in the analog signal domain. As such, it has further been realized that by combining digital signal domain techniques for multiplication and analog signal domain techniques for accumulation, a more efficient multiply-accumulate operation can be achieved. Circuitry that combines analog and digital processing to perform MAC operations is referred to as mixed signal MAC (MS-MAC) circuitry.

FIG. 1A illustrates a neural network accelerator 100 with which one or more illustrative embodiments can be implemented. In some illustrative embodiments, neural network accelerator 100 is implemented in one or more graphics processing units (GPUs), one or more field programmable gate arrays (FPGA), one or more application-specific integrated circuits (ASICs), one or more multi-core central processing units (CPUs) and/or other types of circuitry. By way of example, neural network accelerator 100, or portions thereof, can comprise one or more of the above devices customized for a particular purpose that comprise circuitry (e.g., circuits, processors, memory, etc.) that are programmed with executable program code (e.g., instruction code, computer program code, etc.) or otherwise configured for the particular purpose. By way of example only, the particular purpose can be the implementation and execution of an artificial intelligence system (e.g., machine learning algorithm). Neural network accelerator 100 may also be part of a system-on-chip (SoC), e.g., such as a neuromorphic computing system. However, neural network accelerator 100 can be used in a variety of other applications that would benefit from such artificial intelligence-based decision making.

As shown, neural network accelerator 100 comprises a matrix multiplication engine 102 configured to perform computations corresponding to convolution layers and fully-connected layers of a neural network, which can typically be performed using low precision integer computations on data from memory 104. Results are then forwarded via an output first-in-first-out (FIFO) data structure 106 to a special function unit 108 that performs computations corresponding to one or more activation functions such as, but not limited to, batch normalization, a sigmoid function, a rectified linear unit (ReLU) function, and a SoftMax function. Computations in special function unit 108 typically need to be performed in high-precision to preserve the accuracy of the neural network that is mapped to the accelerator.

However, it is realized that matrix multiplication represents the bulk of the computation in neural network workloads, and thus matrix multiplication engine 102 can consume a significant percentage of the total power consumed by neural network accelerator 100. It is further realized that the low-precision integer computations being performed in matrix multiplication engine 102 can be performed by operating at least partially in the analog domain resulting in an accelerator with lower total power consumption compared to an accelerator that performs the entirety of its computations in the digital domain utilizing digital circuits.

FIG. 1B illustrates a mathematical representation 110, in accordance with an illustrative embodiment, to enable a vector dot product (also referred to as an inner product herein, as will be further explained) computed by one or more multiply-accumulate operations in neural network accelerator 100 of FIG. 1A. In the example of FIG. 1B, the left-side equation mathematically represents the dot product of two vectors x and w, each of size 64, where elements $x_i$ and $w_i$ each have 4 bits. Each four bit by four bit product (4b*4b) is split into 16 one bit by one bit products (1b*1b). The right-side equation mathematically represents the 1b*1b multiplication, where $x_{i,m}$ and $w_{i,n}$ each have 1 bit.

The bit-wise product is performed first, and then the summation is performed based on the weights of the bits. In essence, the 4-bit by 4-bit term is split into 16 one-bit products, and the one-bit products are accumulated (summed) and then appropriately scaled by a power of two by the outer summation to generate an aggregate sum. Based on power considerations, the 1b*1b multiplication is performed in the digital domain, the inner summation of the 1b*1b multiplication is performed in the analog domain, and the outer summation is performed in the digital domain. The inner summation is performed in the analog domain as this is where analog circuitry outperforms digital circuitry in terms of power. The 16-way addition may be performed in the digital domain as there is little advantage to doing this in the analog domain. In one example embodiment, the inputs and outputs of the inner summation are digital.

Note that FIG. 1B represents one illustrative embodiment and thus other embodiments can use different partitioning of analog and digital domain computations. Furthermore, it is also to be appreciated that the dot product computation depicted as mathematical representation 110 is intended as an example to facilitate explanation. Thus, implementations wherein dot products of vectors x and w where elements $x_i$ and $w_i$ have a different number of bits, as well as where one vector has a different number of elements as compared to the other vector, are supported by alternative embodiments based on the teachings provided herein.

Figure 2:
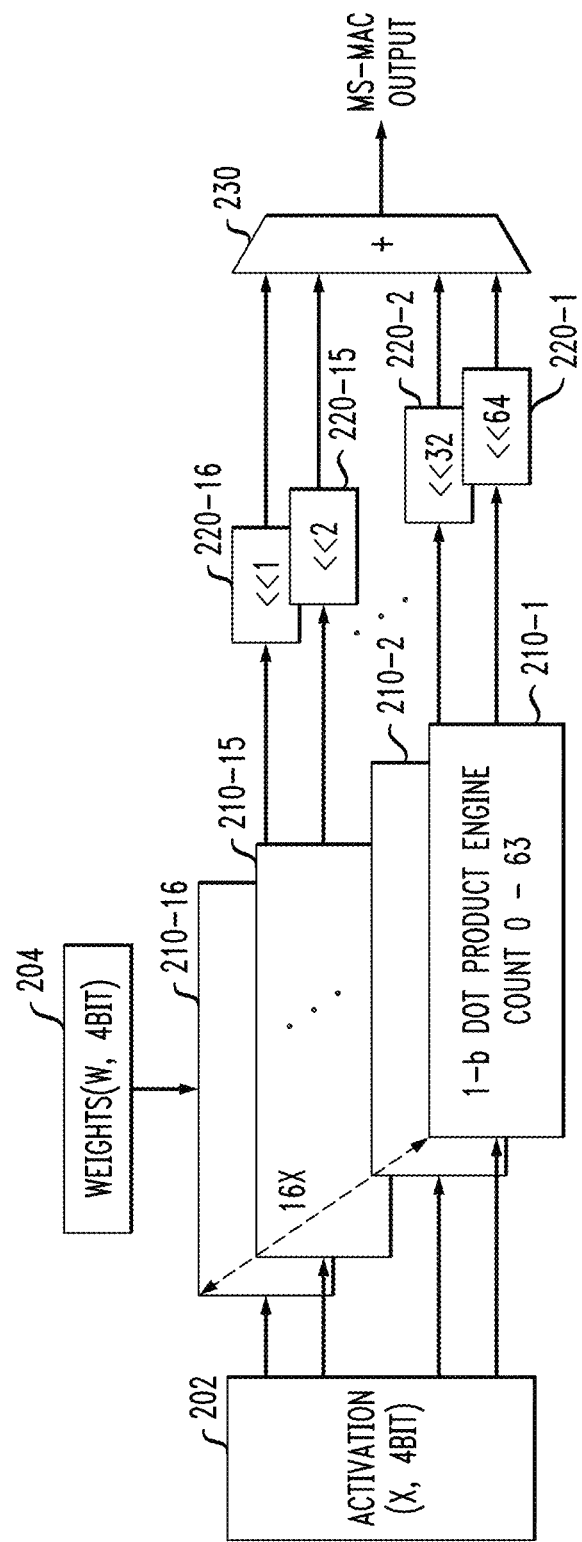
FIG. 2 depicts mixed signal multiply-accumulate circuit with which one or more illustrative embodiments can be implemented.

FIG. 2 illustrates a mixed signal multiply-accumulate circuit 200 for performing integer matrix multiplication, in accordance with an illustrative embodiment. It is to be appreciated that part or all of mixed signal multiply-accumulate circuit 200 can be implemented, in some embodiments, as part of matrix multiplication engine 102 of FIG. 1. As shown, each bit $x_i$ of a first digital input X, and the corresponding bit representing the digital weight $w_i$ of a second digital input W, are input into one of 16 1-bit (1-b) dot product engines 210-1, 210-2 . . . , 210-15, 210-16 (collectively referred to as dot product engines 210 herein). The dot product engines 210 can be referred to as counters since they, effectively, count the number of 1s that occur in the binary multiplication operations, as will be further explained below. In one example, the first digital input X represents an activation function represented by elements of 4 bits, while the second digital input W represents weights represented by elements of 4 bits. Digital partial sums 220-1, 220-2 . . . , 220-15, 220-16 (collectively referred to as partial sums 220 herein) are respectively output by dot product engines 210-1, 210-2 . . . , 210-15, 210-16. Digital partial sums 220 are input into a digital reduction circuit 230 which performs an outer summation to generate the MS-MAC output.

FIGS. 3A-3D illustrate examples of MS-MAC circuitry configured for inner product summation performed by dot product engines 210 in accordance with illustrative embodiments. In the illustrative embodiments of FIGS. 3A-3D, it is assumed that the input vectors X and W each comprise 63 elements, and each element comprises 4 bits. In general, MS-MAC circuitry performs multiplication in the digital signal domain using digital logic and accumulation in the analog domain using charge-sharing capacitors. Effectively, MS-MAC circuitry multiplies digital inputs in the digital domain, accumulates multiplication results in the analog domain, and generates a binary-weighted digital code based on the accumulated results. The number of bits of the binary-weighted digital code are referred to as the analog resolution or quantization level (p) of the analog-to-digital conversion operation performed by MS-MAC circuitry. In order to generate a unique binary-weighted code for a set of 63-bit inputs, p is 6, i.e., D[0: 5]. Throughout FIGS. 3A-3D, circuit elements which provide like or similar functionality utilize the same or similar reference numerals.

Figure 3A:
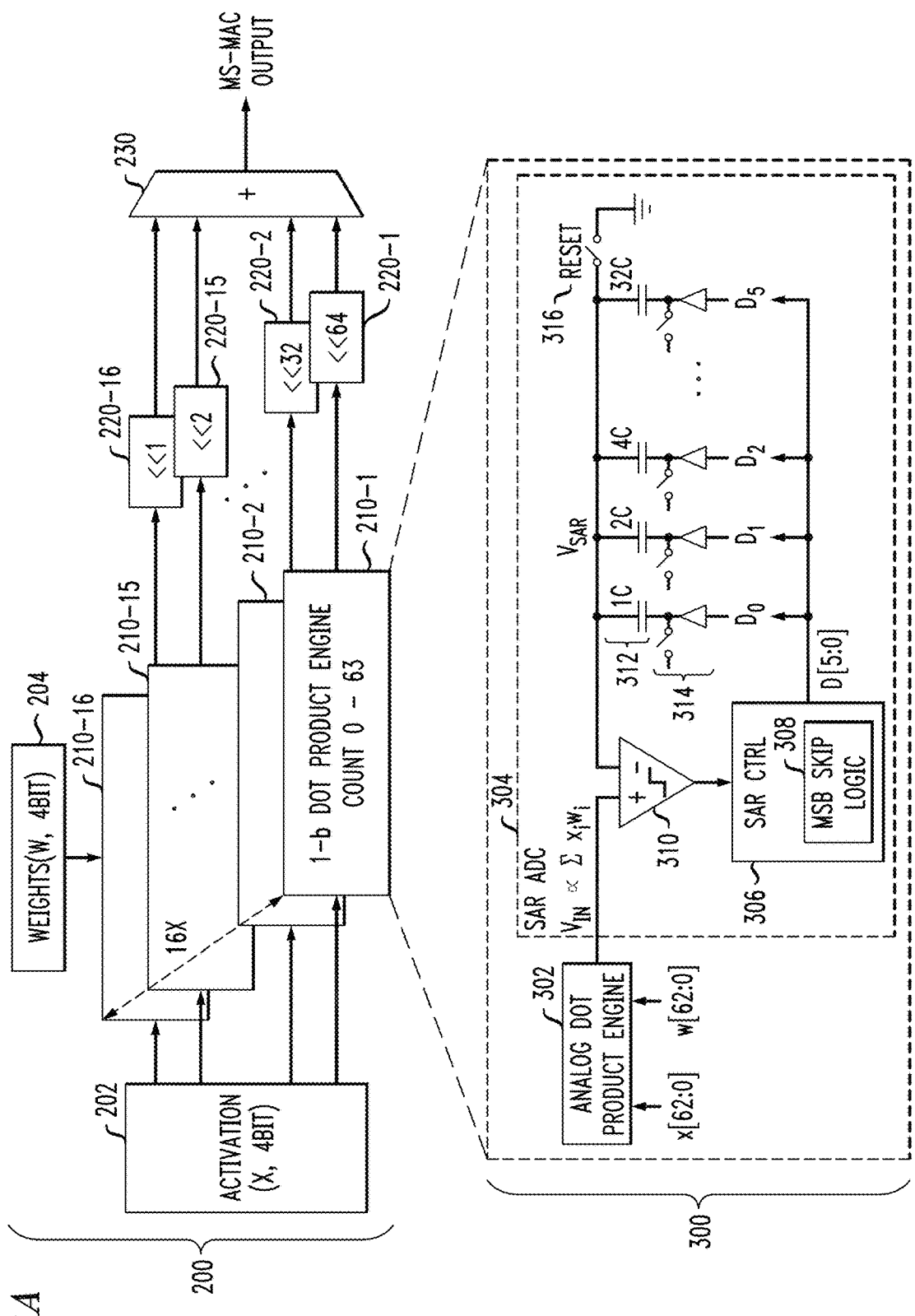
FIGS. 3A-3D depict dot product engines with which one or more illustrative embodiments can be implemented.

More particularly, as shown in FIG. 3A, MS-MAC circuitry 300 includes an analog dot product engine 302 and a successive approximate register (SAR) ADC 304. As shown, the analog dot product engine 302 provides an output $V_{IN}$ to a comparator 310 of the SAR ADC 304, where the input $V_{IN}$ is proportional to the sum of the weights $\Sigma x_i w_i$ produced by the analog dot product engine 302. The analog dot product engine 302 receives inputs x[62: 0] and w[62: 0], and produces the output $V_{IN} \propto \Sigma x_i w_i$. The output of the comparator 310 is input to a SAR controller 306 implementing most significant bit (MSB) skip logic 308 described in further detail elsewhere herein. The SAR controller 306 outputs the binary-weighted code D[0: 5], which is provided to a set of capacitors 312 (with respective capacitance values C, 2 C, 4 C, 8 C, 16 C, 32 C). It is to be appreciated that the bits of the binary-weighted code D[0: 5] are respectively coupled to the set of capacitors 312 (e.g., from the MSB through to the least significant bit (LSB)). For 6-bit quantization, the MSB (D5) of the binary-weighted output of SAR controller 306 is coupled to the 32 C capacitor, the next bit (D4) is coupled to a 16 C capacitor, the next bit (D3) is coupled to an 8 C capacitor, the next bit (D2) is coupled to an 4 C capacitor, the next bit (D1) is coupled to the 2 C capacitor, and the LSB (D0) is coupled to the 1 C capacitor. The binary-weighted code D[0: 5] output from the SAR controller 306 is provided to the bottom plates of the capacitors 312 through a set of buffers and switches 314 as illustrated. The SAR ADC 304 also includes a reset switch 316, which when opened allows the top plates of the capacitors 312 to electrically float.

Figure 3B:
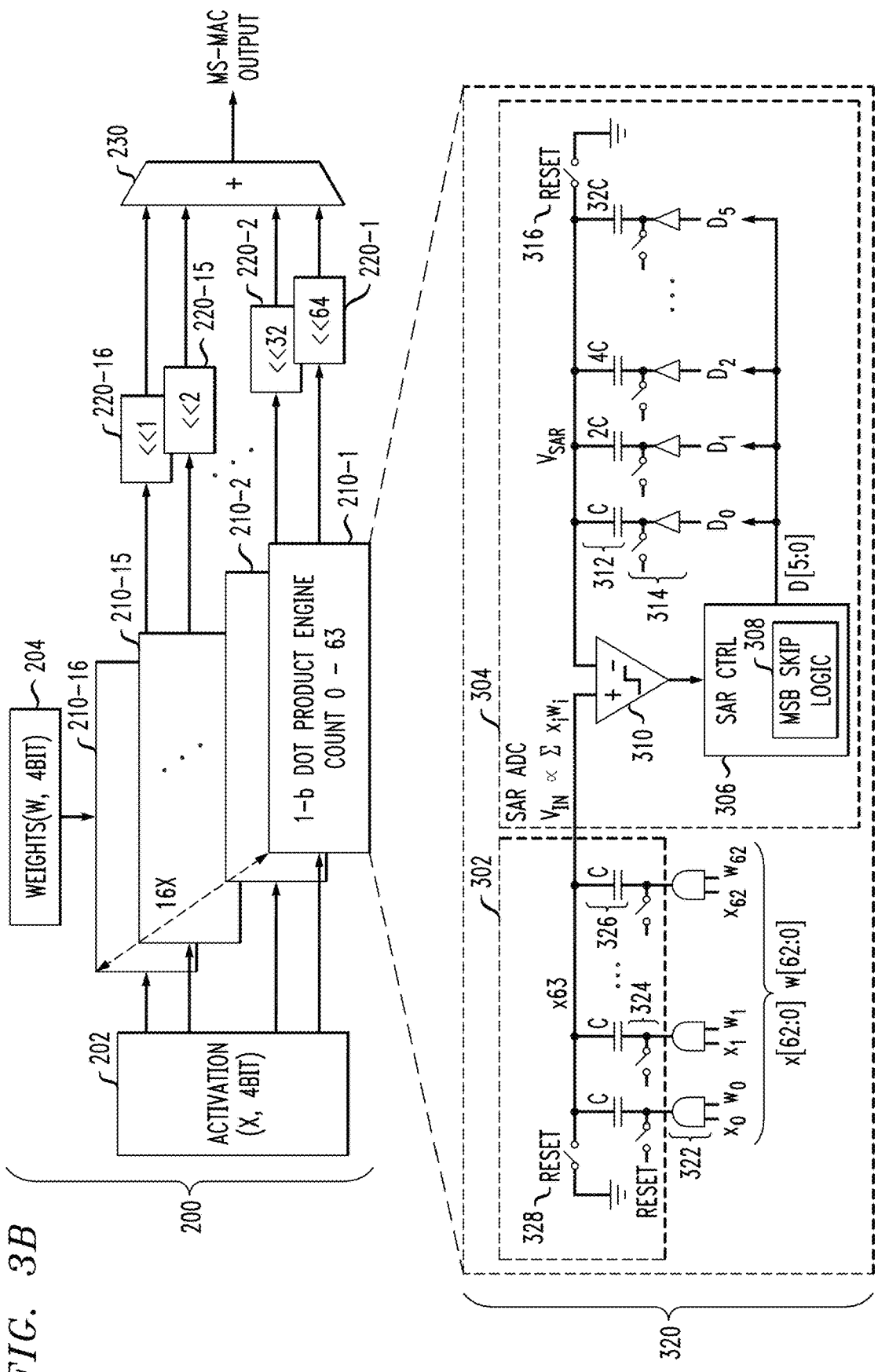

FIG. 3B shows MS-MAC circuitry 320 illustrating an example implementation of the analog dot product engine 302. As shown in FIG. 3B, the analog dot product engine 302 includes a set of 63 AND gates 322, each of which performs multiplication of a corresponding set of the inputs x[62: 0] and w[62: 0]. The outputs of the AND gates 322 (i.e., $x_0 * w_0$, $x_1 * w_1$, . . . , $x_{62} * w_{62}$) are coupled via reset switches 324 to bottom plates of capacitors 326, each of which has a same capacitance value C. The analog dot product engine 302 further includes a reset switch 328. The top plates of the capacitors 326 provide the output $V_{IN} \propto \Sigma x_i w_i$ to the comparator 310.

Figure 3C:
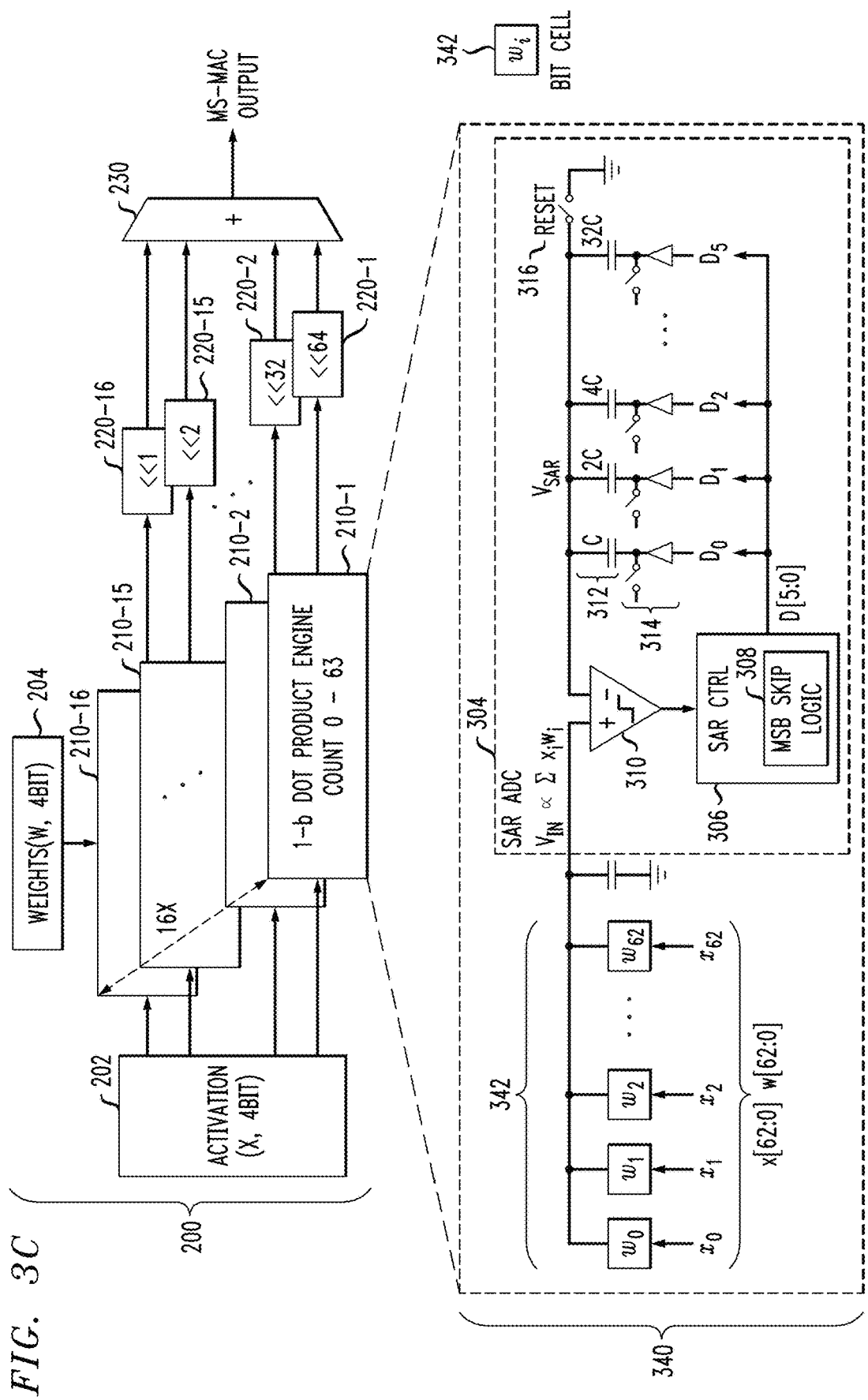

FIG. 3C shows MS-MAC circuitry 340, which includes the SAR ADC 304 that functions in a manner similar to that described above with respect to FIG. 3A. The MS-MAC circuitry 340 also includes a set of bit cells 342. The bit cells 342 may be implemented as resistive random-access memory (RRAM), magnetoresistive random-access memory (MRAM), static random-access memory (SRAM), etc. The bit cells 342 may act as resistive processing units (RPUs), with each of the bit cells 342 storing a value of one of $w_i$. The inputs $x_i$ when applied to the bit cells 342 act to multiple $x_i * w_i$ so as to produce $V_{IN}$.

Figure 3D:
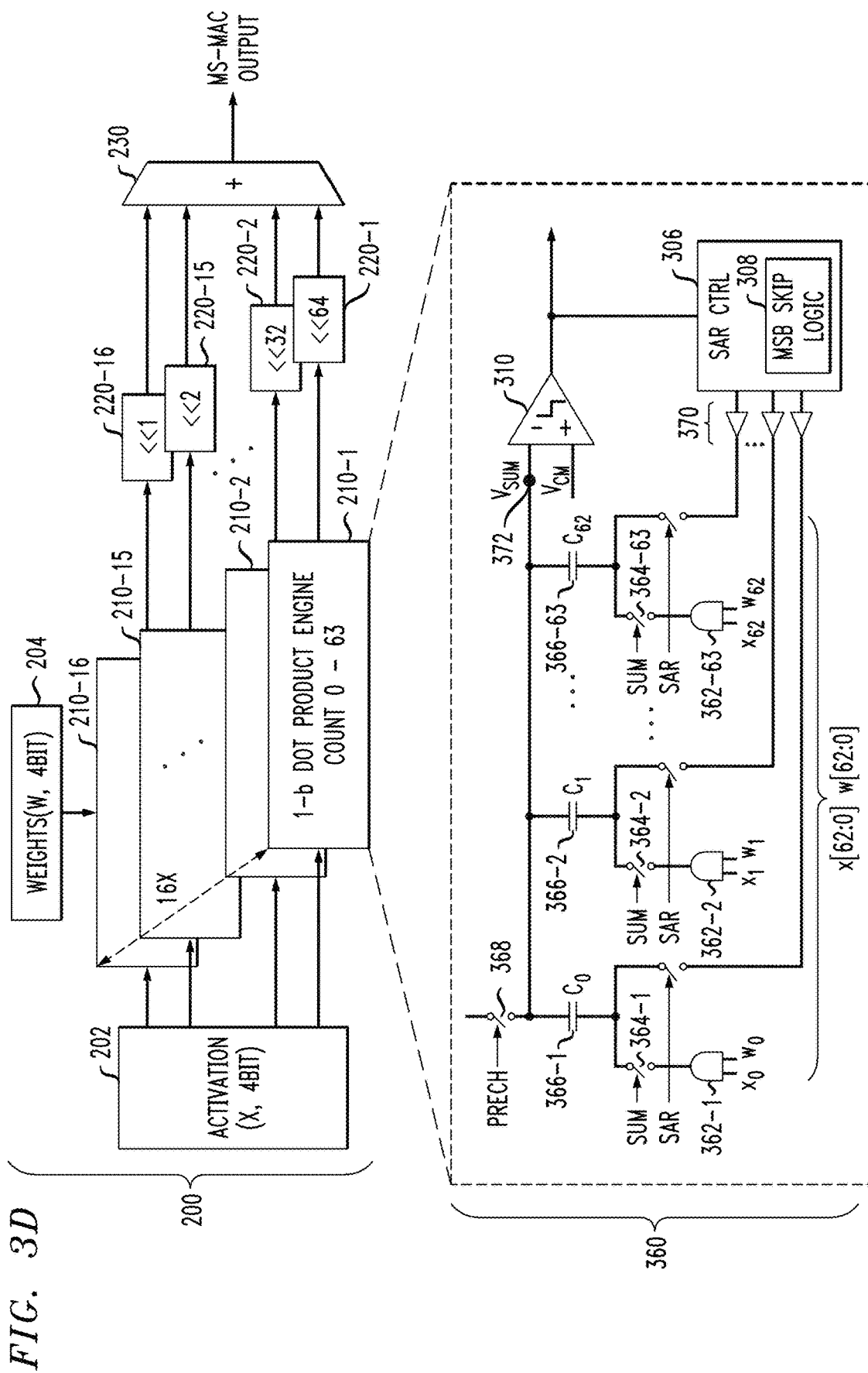

FIG. 3D shows MS-MAC circuitry 360 including input terminals of a set of digital (logical) AND gates 362-1, 362-2, . . . , 362-63 (collectively referred to as AND gates 362 herein) which are respectively connected to data inputs $x_0 w_0$, $x_1 w_1$ . . . , $x_{62} w_{62}$, while output terminals of the set of AND gates 362 are respectively connected to a set of switch pairs 364-1, 364-2, . . . , 364-63 (collectively referred to as switch pairs 364). Switch pairs 364 enable MS-MAC circuitry 360 to switch between a summation operating phase and an SAR operating phase, as will be further explained, via control inputs "sum" and "sar" generated by SAR controller 306. The SAR controller 306 is configured to implement MSB skip logic 308, which will be described in further detail elsewhere herein.

The switch pairs 364 are connected to respective bottom plates of a set of capacitors 366-1, 366-2, . . . , 366-63 collectively referred to as capacitors 366. Capacitors 366 each have the same capacitance $C_0=C_1=\ldots=C_{63}$. Top plates of capacitors 366 are connected to a first input of comparator 310 as well as to a precharge switch 368. Precharge switch 368 selectively applies a common mode voltage $V_{CM}$ to the top plates of capacitors 366 via control signal "prech," as will be further explained. A second input of comparator 310 is connected to $V_{CM}$. The voltage $V_{CM}$ is set to the natural common-mode voltage of comparator 310, the voltage at which comparator 310 is most likely to have the best sensitivity/noise characteristics. The output of comparator 310 is connected to the SAR controller 306. SAR controller 306 outputs the binary-weighted code D[0: 5]. Note also, as shown, data inputs and control inputs are each buffered by buffers 370. A clock signal (clk, not expressly shown) synchronizes the timing between SAR controller 306 and comparator 310, which may be buffered by a clock buffer (not expressly shown).

As illustrated in FIG. 3D for the MS-MAC circuitry 360, the same set of capacitors 366 is utilized for both input summation and SAR conversion. This alleviates issues related to charge sharing attenuation as well as capacitor non-linearity. During the input summation phase, capacitors 366 are controlled individually, while during the SAR conversion operations, capacitors 366 are controlled in a binary weighted manner.

During a first operating phase (sum), precharge switch 368 is closed, such that $V_{SUM}$, the voltage at common node 372, is equal to $V_{CM}$, and the inputs of comparator 310 are effectively electrically shorted. Simultaneously, the product of each pair of inputs $x_i$, $w_i$ is computed by AND gates 362 and applied to the bottom plate of each of capacitors 366 individually by switching the sum switch of each switch pair 364 to be closed and the SAR switch of each switch pair 364 to be open. The bottom plate of each of capacitors 366 is charged to either a reference voltage ($V_{REF}$, not expressly shown) or 0V at the end of the first phase of operation, depending on the logical output of the corresponding AND gate 362. Thus, each capacitor 366 stores the charge $Q_i=C(x_i^*w_i^*V_{REF}-V_{CM})$.

During a second operating phase (SAR), the precharge switch 368 is first opened and the common node 372 connecting the top plates of capacitors 366 is allowed to electrically float. Next, switch pairs 364 are configured to pass the control output of SAR controller 306 (the sum switch of each switch pair 364 is opened and the SAR switch of each switch pair 364 is closed) such that the output (through buffers 370) of SAR controller 306 controls an operating configuration of capacitors 366. That is, the set of capacitors 366 is configured as an array of binary-weighted capacitances in this phase, i.e., subsets of capacitors 366 are connected to predetermined ones of the bit control lines, e.g., LSB through MSB, of SAR controller 306. The bit control lines respectively correspond to the bits in the binary-weighted output (code) generated by SAR controller 306, e.g., D[0: 5] for a quantization level of 6. That is, given ones of capacitors 366 are connected to a given one of the bit control lines, when the SAR control signal closes the corresponding switches of switch pairs 364. For 6-bit quantization, the MSB (D5) of the binary-weighted output of SAR controller 306 is coupled to capacitors 306-32 through 306-63 (32 capacitors), the next bit (D4) is coupled to capacitors 306-16 through 306-31 (16 capacitors), the next bit (D3) is coupled to capacitors 306-8 through 306-15 (8 capacitors), the next bit (D2) is coupled to capacitors 306-4 through 306-7 (4 capacitors), the next bit (D1) is coupled to capacitors 306-2 and 306-3 (2 capacitors), and the LSB (D0) is coupled to capacitor 306-1 (1 capacitor).

Depending on the result of the multiplication by the AND gates 362 and the resulting charge stored by the set of capacitors 366, a decision is made by comparator 310 (1 or 0) in successive iterations for each of the output bits D[0: 5]. It therefore takes six SAR iterations to generate a 6-bit binary-weighted output for the 63-way data input shown in FIG. 3D.

To summarize the dot product computation performed by MS-MAC circuitry 360 of FIG. 3D, in the first operating phase ($1^{st}$ cycle), AND gates 362 multiply the data received at their respective inputs and the outputs of AND gates 362 drive capacitors 366. Then, in the second operating phase ($2^{nd}$ through $7^{th}$ cycle, i.e., corresponding to a 6-bit binary-weighted output), regular SAR ADC operation is performed as explained above.

FIG. 4 depicts an algebraic representation 400 associated with the dot product computation performed by MS-MAC circuitry 300, 320, 340 and 360 depicted in FIGS. 3A-3D. The mixed signal dot product engine (MS-DPE) counts the number of 1's in 63-way binary multiplication. It is realized herein, and as mentioned above, that the total energy consumption and thus the energy efficiency of matrix multiplication engine 102 is dominated by the energy consumption of dot product engine 210 which is further dominated by the ADC conversion energy of MS-MAC circuitry. For example, in the context of MS-MAC circuitry 360 of FIG. 3D, the energy consumption associated with components involved in the SAR ADC operation contribute over 75% of the total energy consumption. Illustrative embodiments provide solutions for addressing this and other issues, at least in part through the use of the MSB skip logic 308.

FIGS. 5A through 5C depict dot product statistics utilized according to illustrative embodiments. More particularly, table 500 depicts the probability P of individual bits in a dot product for input vectors X and W. As shown, $P(X_i=0)=0.5$ and $P(W_i=0)=0.5$, while $P(X_iW_i=0)=0.25$. Table 510 depicts the output probability P in a 2-b dot product engine ($\Sigma_{i=1}^{2}X_iW_i$). It is noted that 81.25% of the time, the MSB of the output (2 bit) is zero for uniformly random X, W. In turn, the output probability P in a 63-b dot product engine (e.g., 210 in FIGS. 2 and 3A-3D) is shown in table 520. Accordingly, $P(\Sigma_{i=1}^{63}X_iW_i\leq32)\approx1$ and the MSB of a 63-b dot-product output is almost always zero. In other words, due to the logical AND operations of X and W, the dot product output (e.g., the SAR ADC output) is highly likely to have a '0' MSB. Illustrative embodiments exploit this realization and provide a dot product computation methodology with which ADC conversion can start from the $(MSB-1)^{th}$ bit, i.e., such embodiments assume that the MSB equals zero and effectively skip the MSB in the computation. In the low-probability event that MSB is equal to 1 (e.g., n consecutive bits from $(MSB-1)^{th}$ bit are all 1, or some alternative detected condition), as will be further explained, this occurrence is detected and the SAR ADC operation is restarted subject to a limited number of penalty cycles. Advantageously, MSB skipping according to illustrative embodiments does not require any precomputation of weights or activation.

Figures 6, 7:
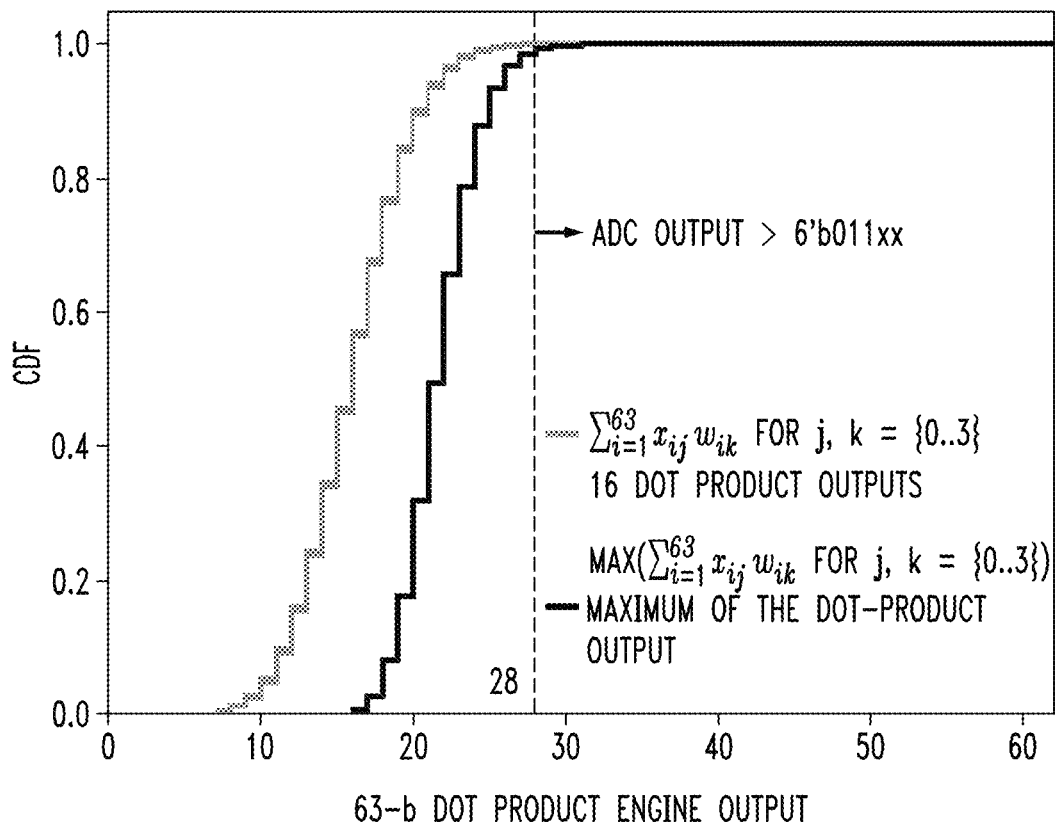
FIG. 6 depicts motivation for energy efficient analog-to-digital conversion implementing most-significant bit skipping in a dot product engine according to an illustrative embodiment.
FIG. 7 depicts a mathematical representation of energy efficient analog-to-digital conversion implementing most-significant bit skipping in a dot product engine according to an illustrative embodiment.

FIG. 6 depicts a graph 600 which further illustrates the motivation for MSB skipping in a dot product engine according to an illustrative embodiment. As graphically shown in the context of a cumulative distribution function (CDF), outputs of all 16 63-b dot product engines 210 in FIGS. 2 and 3A-3D are less than 28 (6'b011100) with a probability of greater than 98.9%.

It should be noted that, for clarity of illustration, various embodiments are described with respect to MSB skip logic 308 which skips only the MSB. The MSB skip logic 308, however, may instead "skip" the k most significant bits, where k≥1. The choice of k may be based at least in part on an analysis of the output probability distribution for the dot-product engine that is utilized as described above with respect to FIGS. 5A-5C and 6.

FIG. 7 depicts a mathematical representation 700 of energy efficient analog-to-digital conversion implementing most-significant bit skipping in a dot product engine according to an illustrative embodiment. More particularly, the ADC computation portion of MS-MAC circuitry in a D-bit dot product engine is represented as:

$$ADC\ Cycles = \begin{cases} N-1 \\ n+N, \end{cases}$$

$$1 \le n \le N-1,$$

where N=ceiling(log$_2$(D)), and n is minimum number of bits from the (MSB−1)$^{th}$ position after which probability of error is very low. As shown in the mathematical representation 700 of FIG. 7, there are two possibilities. The first is where MSB skipping is utilized, and there are N−1 cycles in the D terms dot-product engine. If it is determined that n consecutive bits from the (MSB−1)$^{th}$ position are all "1" (e.g., indicative of the low probability event that the MSB is equal to 1), then computation is restarted and the number of cycles is n+N, where 1≤n≤N−1. Additional or alternative detected conditions can be used to trigger restarting the ADC computation. Further, in some embodiments some amount of error may be tolerated, such that even when such conditions are detected computation is not restarted.

There are typically multiple dot-product engines in a MS-MAC. For example, as shown in FIGS. 2 and 3A-3D, for a 4-b X and W, 16 dot-product engines are required to compute the following:

$$\Sigma_{i=1}^{63} X_i W_i = \Sigma_{i=1}^{63} (8x_{i3}+4x_{i2}+2x_{i1}+x_{i0})(8w_{i3}+4w_{i2}+2w_{i1}+w_{i0})$$

A conservative choice of n increases the error penalty, but ensures a low probability of any dot-product engine output to be more than:

$$\underset{(n)}{\underbrace{0\ 1\ 1\ ...\ 1\ 1}}\ \underset{(N-n-1)}{\underbrace{0\ 0\ ...\ 0\ 0}}$$

All the dot-product engines take (n+N) cycles when error is detected (all n bits 1) in any one of them.

FIG. 8 depicts a process cycle flow 800 to demonstrate the error tolerance associated with implementing MSB skipping in a dot product engine according to an illustrative embodiment. More particularly, the process cycle flow 800 illustrates cycles 0 through 5 for both normal operation 810 (e.g., where the MSB is not skipped) and for the energy efficient operation 820 (e.g., where the MSB is skipped). For normal operation 810, in cycle 0 the MSB is calculated, which may have a value C that is equal to 0 or 1. In the next cycle, the (MSB−1)$^{th}$ is calculated, which again may correspond to C being equal to 0 or 1. This continues in the subsequent cycles (e.g., cycles 2 and onwards). According to an illustrative embodiment, for the energy efficient operation 820, cycle 0 may be "skipped" by assuming that the MSB is 0, and processing may start from cycle 1 with that assumption. As noted above, in some embodiments MSB skipping may include skipping the k most significant bits, where k≥1, and thus the energy efficient operation 820 may skip multiple cycles (e.g., for k=2, cycle 0 and cycle 1 would be skipped).

Computation in the energy efficient operation 820 is "restarted" if in n subsequent cycles the bits are 1. When restarting, the process moves to normal operation 810 where the MSB is not skipped. As shown in FIG. 8, the average conversion cycles is represented as:

$$P(\Sigma X^*W<E_{TH})^*(N-1)+P(\Sigma X^*W\ge E_{TH})^*(N+n)$$

where $E_{TH}$ represent the low probability event described above, i.e., $$E_{TH} = \underset{(n)}{\underbrace{0\ 1\ 1\ ...\ 1\ 1}}\ \underset{(N-n-1)}{\underbrace{0\ 0\ ...\ 0\ 0}}$$

The average conversion cycles may also be represented as:

$$(\Sigma X^*W<E_{TH})^*(\log_2 D-1)+P(\Sigma X^*W\ge E_{TH})^*(\log_2 D+n)$$

As noted above, for a 63-way MAC with 4-b X and W, the value of $E_{TH}$=28, such that:

$$P(X^*W<28)^*5+P(\Sigma X^*W\ge 28)^*9=5.0444$$

Figure 9B:
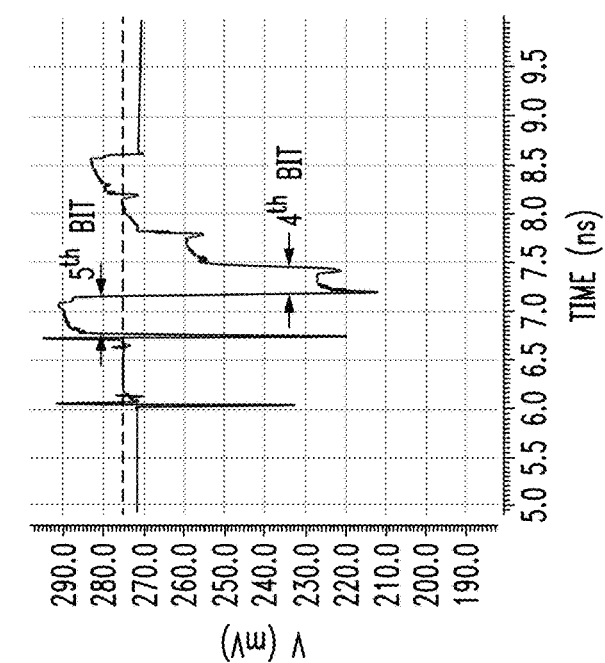
FIGS. 9A and 9B illustrate an energy savings comparison according to an illustrative embodiment.
Figure 9A:
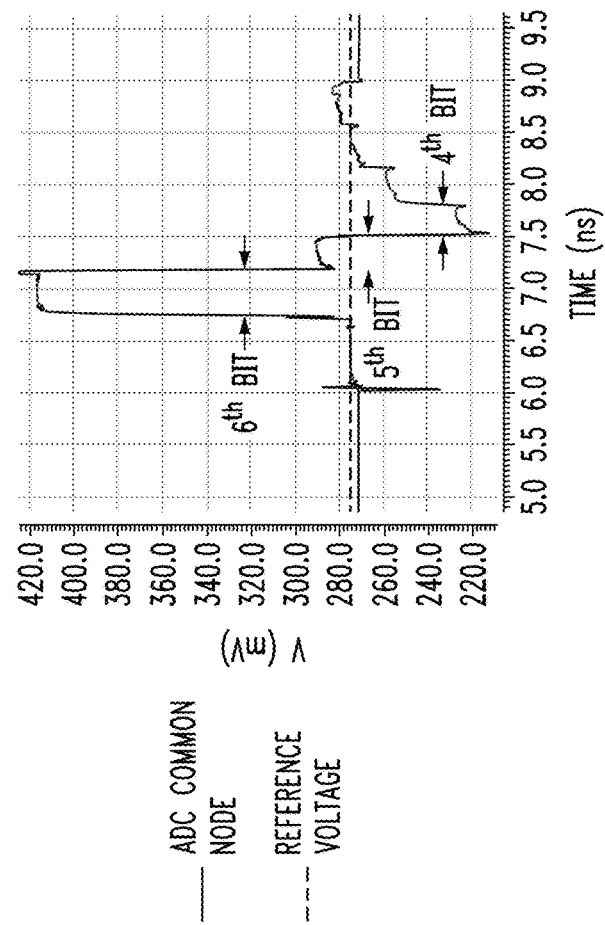

FIGS. 9A through 9C illustrate an energy savings comparison according to an illustrative embodiment. More particularly, for a 6-bit binary-weighted output in the ADC SAR operation, graph 900 illustrates an original approach (e.g., where MSB skipping is not used) while graph 910 illustrates an energy efficient approach (e.g., where MSB skipping is used) according to an illustrative embodiment. The use of the energy efficient approach may provide significant energy savings (e.g., 25% or more) relative to the normal approach. Such energy savings may be achieved through reducing energy consumption of various components of an MS-MAC circuit (e.g., ADC bottom plate energy, SAR control and driver energy, etc.), where such reduction more than offsets any increase in control energy required to provide bit reconfigurability.

Figure 10:
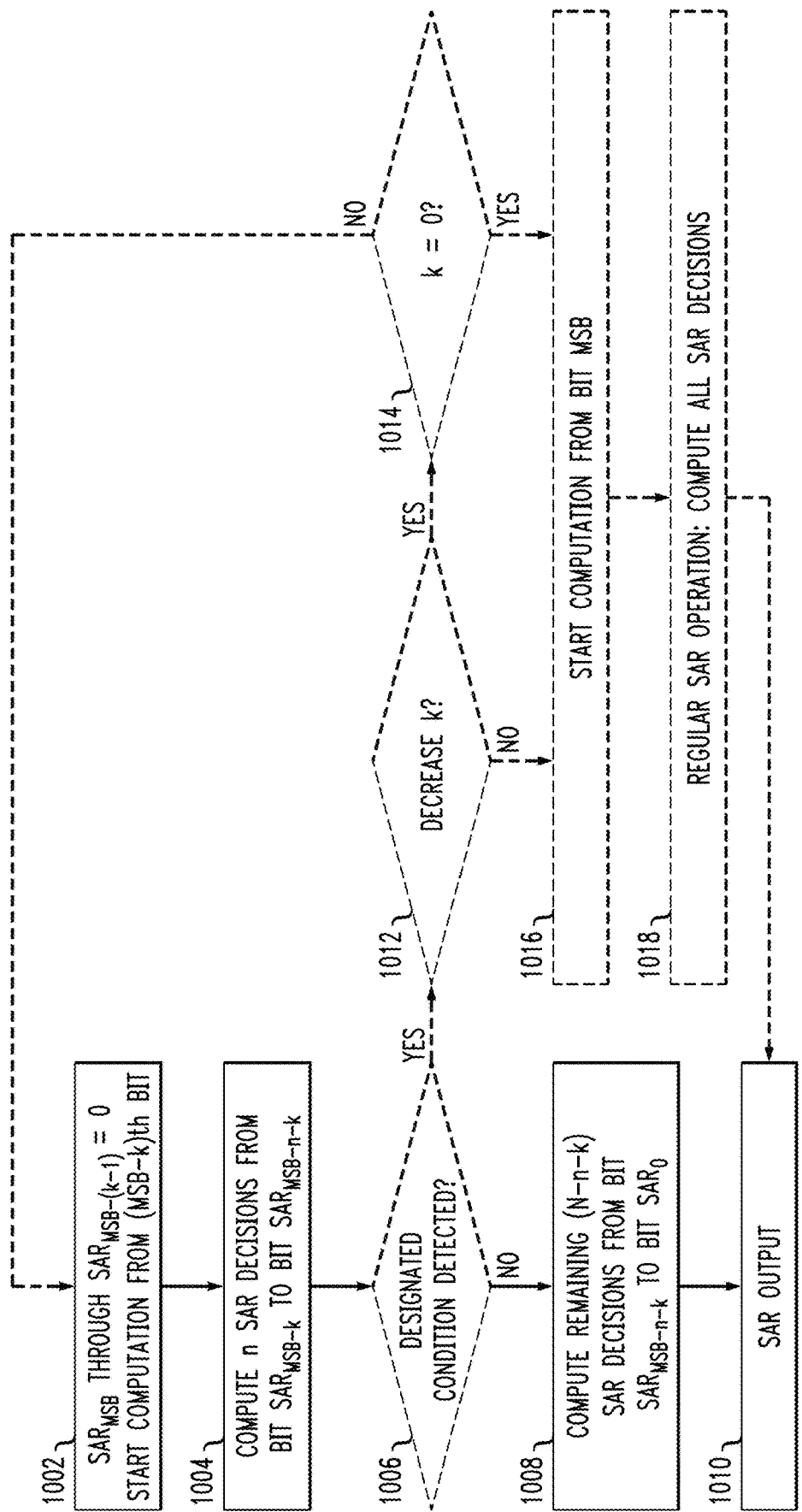
FIG. 10 depicts a methodology for energy efficient analog-to-digital conversion implementing bit skipping for use in a dot product engine according to an illustrative embodiment.

FIG. 10 depicts a methodology 1000 for energy-efficient mixed signal dot-product computations utilizing skipping of the k most significant bits, where k≥1. The methodology 1000 is an example of functionality implemented by the MSB skip logic 308 of the SAR controller 306 described above. The methodology 1000 begins in step 1002, where an assumption is made that the k most significant bits are 0 (e.g., that $SAR_{MSB}$ through $SAR_{MSB-(k-1)}$ are 0). For example, if k=1 (corresponding to skipping only the MSB), then it is assumed that $SAR_{MSB}$=0. If k=2 (corresponding to skipping the two most significant bits, MSB and MSB−1, it is assumed that $SAR_{MSB}$=$SAR_{MSB-1}$=0. Computation is started from the (MSB−k)$^{th}$ bit. In step 1004, n SAR decisions are computed from $SAR_{MSB-k}$ to $SAR_{MSB-n-k}$.

Following step 1004, the methodology 1000 either proceeds to a decision block 1006, or continues directly to step 1008. The decision block 1006 is used to determine whether computations should be restarted in response to detecting one or more designated conditions. Such designated conditions may be detected based at least in part on the values of the SAR decisions computed for $SAR_{MSB-k}$ to $SAR_{MSB-n-k}$. As described elsewhere herein, such restarting of the computation is not a requirement, such as in cases where inexact computations can be tolerated. For such embodiments, the decision block 1006 may be skipped and processing proceeds directly from step 1004 to step 1008.

If the decision block 1006 is not skipped, a determination is made to as whether computations should be restarted based on whether one or more designated conditions are detected. An example of a designated condition which may trigger restarting of the computation is a determination that the computations of step 1004 all produce an output of 1 (e.g., whether $SAR_{MSB-k}{:}SAR_{MSB-k-n+1}$=n'b111 . . . 1). If the result of the step 1006 determination is no, the methodology proceeds to step 1008 where the remaining (N–n–k) SAR decisions are computed, from bit $SAR_{MSB-n-k}$ to bit $SAR_0$, and in step 1010 an accurate SAR output is produced.

If the result of the step 1006 determination is yes, the methodology 1000 proceeds to another decision block 1012. In the decision block 1012, a determination is made as to whether to proceed directly to restarting computation from the MSB, or whether the value of k should be decreased such that the MSB skip logic is tried again while skipping fewer than the k most significant bits. If the result of the decision block 1012 is yes, then the value of k is decreased. In some embodiments, k is decremented by 1 each time the decision block 1012 outputs yes (e.g., such that in successive iterations, the MSB skip logic is retried while skipping as many bits as possible). In other embodiments, to reduce the "penalty" associated with repeated restarting of computation, k may be decremented by more than 1 each time the decision block 1012 outputs yes. The methodology 1000 then proceeds to decision block 1014, which determines whether the current value of k=0 following the decrease applied when the decision block 1012 outputs yes. If the result of the decision block 1014 is yes, this corresponds to a case where there is no "skipping" and the methodology 1000 proceeds to step 1016 where computation is started from the MSB. If the result of the decision block 1014 is no (e.g., that k>0 following the decrease applied when the decision block 1012 outputs yes), then processing returns to step 1002 using the new, decreased value of k.

If the result of the decision bock 1012 is no or if the result of the decision block 1014 is yes, computation is restarted from the MSB in step 1016. Regular SAR operation is then followed in step 1018, followed by accurate SAR output in step 1010. The output of the decision block 1012 may be controlled based on various factors, such as the number of iterations of steps 1002 and 1004 which have already been performed. In some embodiments, a threshold is set for the number of iterations, such that bit skipping will be tried only the threshold number of times before decision block 1012 results in no and computation is restarted from the MSB in step 1014. The threshold may in some embodiments be set to 1 (e.g., such that the decision block 1012 will always output no and computations are restarted from the MSB in step 1016 whenever decision block 1006 outputs yes).

Consider an example where, in a first iteration, steps 1002 and 1004 are performed with k=2, such that the two most significant bits are "skipped." If a designated condition is detected in decision block 1006, and if the decision block 1012 outputs yes, then k may be decreased by 1. A second iteration of steps 1002 and 1004 may then be performed with k=1, such that only the MSB is skipped in the second iteration. If a designated condition is again detected in decision block 1006, then processing will proceed to step 1016 where computation is started from the MSB (e.g., as even if decision block 1012 outputs yes, k would be decreased to 0 and thus decision block 1014 would output yes and the methodology would proceed to step 1016).

Figure 11:
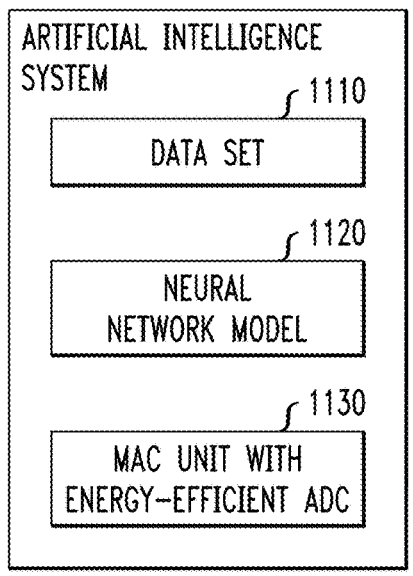
FIG. 11 depicts an exemplary implementation of an artificial intelligence system according to an illustrative embodiment.

FIG. 11 depicts an exemplary implementation of an artificial intelligence system 1100 according to an illustrative embodiment. As shown, system 1100 comprises a data set 1110, a neural network model 1120, and a MAC unit with energy-efficient ADC 1130. The MAC unit with energy-efficient ADC 1130 implements MSB skipping (e.g., MSB skip logic 309) as described elsewhere herein, to perform computations for the neural network model 1120 utilizing the data set 1110, which may comprise training data in a training mode or inference data set in an inference mode.

In one exemplary embodiment, the artificial intelligence system 1100 is implemented by one or more application-specific integrated circuits (ASICs). ASICs are integrated circuit (IC) chips or devices customized for a particular purpose that comprise logic (e.g., circuitry, processors, memory, etc.) that are programmed with executable program code (e.g., instruction code, computer program code, etc.) or otherwise configured for the particular purpose. In this exemplary case, the particular purpose is the implementation and execution of an artificial intelligence system (e.g., machine learning algorithm). An ASIC is also considered a system-on-chip (SoC). Some ASIC implementations that can be used with one or more illustrative embodiments employ cell libraries of user selectable basic logic functions (e.g., a multiplexer, a comparator, etc. that are comprised of multiple VLSI transistor devices to provide various functions such as switching, comparing, etc.) to enable configuration (and reconfiguration) of the system.

It is to be further appreciated that artificial intelligence system 1100 and the parts thereof can be realized in alternative circuitry/processor-based technology such as technology including one or more multi-core central processing units (CPUs), one or more graphics processing units (GPUs), and one or more field programmable gate arrays (FPGAs). In some embodiments, artificial intelligence system 1100 can be implemented as a combination of two or more circuitry/processor-based technologies (e.g., ASIC, CPU, GPU, FPGA, etc.).

The techniques depicted in FIGS. 1-11 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIGS. 1-11 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

In some embodiments, an apparatus comprises at least one processor and at least one memory including instruction code. The at least one memory and the instruction code are configured to, with the at least one processor, cause the apparatus at least to perform an analog-to-digital conversion of an analog input to a digital output comprising a set of bits, the set of bits comprising a most significant bit and one or more additional bits, the analog-to-digital conversion starting at a given one of the one or more additional bits following the most significant bit.

The at least one memory and the instruction code are further configured to, with the at least one processor, cause the apparatus to detect one or more designated conditions and, responsive to detecting at least one of the one or more designated conditions, restart the analog-to-digital conversion starting at another one of the set of bits. Detecting said at least one of the one or more designated conditions may be based at least in part on values of a threshold number of consecutive ones of the one or more additional bits following the given one of the one or more additional bits. The threshold number may be selected based at least in part on at least one of: an output probability distribution of a dot-product engine performing a binary multiplication of first and second vectors; and a tolerable error in an output of the analog-to-digital conversion.

The given one of the one or more additional bits following the most significant bit may comprise a first one of the one or more additional bits following the most significant bit, and restarting the analog-to-digital conversion starting at the other one of the set of bits may comprise restarting the analog-to-digital conversion starting at the most significant bit.

The given one of the one or more additional bits following the MSB may comprise an (MSB−k)th bit and restarting the analog-to-digital conversion starting at the other one of the set of bits may comprise restarting the analog-to-digital conversion starting at an (MSB−k+l)th bit, where l is an integer greater than or equal to one. A value of k may be selected based at least in part on at least one of: an output probability distribution of a dot-product engine performing a binary multiplication of first and second vectors; and a tolerable error in an output of the analog-to-digital conversion.

In some embodiments, a method comprises the step of performing an analog-to-digital conversion of an analog input to a digital output comprising a set of bits, the set of bits comprising a most significant bit and one or more additional bits, the analog-to-digital conversion starting at a given one of the one or more additional bits following the most significant bit. The method is executed by processing circuitry configured to execute instruction code.

The method may further comprise the steps of detecting one or more designated conditions and, responsive to detecting at least one of the one or more designated conditions, restarting the analog-to-digital conversion starting at another one of the set of bits. The given one of the one or more additional bits following the MSB may comprise an (MSB−k)th bit and restarting the analog-to-digital conversion starting at the other one of the set of bits may comprise restarting the analog-to-digital conversion starting at an (MSB−k+l)th bit, where l is an integer greater than or equal to one.

In some embodiments, an article of manufacture comprises a non-transitory computer-readable storage medium having embodied therein executable instruction code that when executed by a processor causes the processor to perform the step of performing an analog-to-digital conversion of an analog input to a digital output comprising a set of bits, the set of bits comprising a most significant bit and one or more additional bits, the analog-to-digital conversion starting at a given one of the one or more additional bits following the most significant bit.

The executable instruction code when executed by the processor further causes the processor to perform steps of detecting one or more designated conditions and, responsive to detecting at least one of the one or more designated conditions, restarting the analog-to-digital conversion starting at another one of the set of bits. The given one of the one or more additional bits following the most significant bit (MSB) may comprise an (MSB−k)th bit and restarting the analog-to-digital conversion starting at the other one of the set of bits may comprise restarting the analog-to-digital conversion starting at an (MSB−k+l)th bit, wherein l is an integer greater than or equal to one.

In some embodiments, a system comprises a dot-product summation computation unit configured to perform binary multiplication of first and second vectors, a SAR ADC unit configured to convert an analog output of the dot-product summation computation unit to a digital output comprising a set of bits, the set of bits comprising a most significant bit and one or more additional bits, and controller logic operatively coupled to the SAR ADC unit, the controller logic being configured to determine values of the set of bits of the digital output based at least in part on a comparison of an output of the dot-product summation computation unit and a sequence of weighted binary codes. The sequence of weighted binary codes starts from a given one of the one or more additional bits following the most significant bit.

The given one of the one or more additional bits following the MSB may comprise an (MSB−k)th bit, and the controller logic may be further configured, responsive to detecting one or more designated conditions based at least in part on values of a threshold number of consecutive ones of the one or more additional bits following the given one of the one or more additional bits, to restart determination of the values of the set of bits of the digital output with a new sequence of weighted binary codes that starts from an (MSB−k+l)th bit, where l is an integer greater than or equal to one.

The system may be implemented as part of an artificial intelligence system, as part of one or more integrated circuits, combinations thereof, etc.

In some embodiments, a device comprises dot-product summation circuitry configured to output a first signal, the first signal comprising a dot-product sum of binary multiplication of first and second vectors, and a SAR ADC configured to perform conversion of the first signal output by the dot-product summation circuitry to a digital output comprising a set of bits, the set of bits comprising a most significant bit and one or more additional bits. The SAR ADC comprises SAR controller circuitry configured to output a second signal and comparator circuitry comprising a first input node coupled to the dot-product summation circuitry, a second input node coupled to the SAR circuitry, and an output node configured to provide an output value based at least in part on a comparison of the first value output by the dot-product summation circuitry and the second value output by the SAR controller circuitry. The SAR controller circuitry is configured to determine values of the set of bits of the digital output based at least in part on output values of the comparator circuitry produced as a sequence of weighted binary codes is output as the second signal. The sequence of weighted binary codes starts from a given one of the one or more additional bits following the most significant bit.

The given one of the one or more additional bits following the MSB comprises an (MSB−k)th bit, and the SAR controller circuitry may be further configured, responsive to detecting one or more designated conditions based at least in part on values of a threshold number of consecutive ones of the one or more additional bits following the given one of the one or more additional bits, to restart determination of the values of the set of bits of the digital output based at least in part on output values of the comparator circuitry produced as a new sequence of weighted binary codes are output as the second signal, the new sequence of weighted binary codes starting from an (MSB−k+l)th bit, where l is an integer greater than or equal to one.

The SAR controller circuitry may be coupled to the comparator circuitry via a plurality of capacitors.

The plurality of capacitors may have respective different capacitance values. The dot-product summation circuitry may comprise a plurality of logical AND gates each receiving as input a first vector element of the first vector and a second vector element of the second vector, the plurality of logical AND gates having respective outputs coupled to first plates of the plurality of capacitors.

Each of the plurality of capacitors may alternatively have a same capacitance value, and a plurality of switches may be coupled between respective ones of the plurality of logical AND gates and the plurality of capacitors, the plurality of switches being configured to switch between a first mode of operation wherein a voltage on a common line coupled to second plates of the plurality of capacitors represents the dot-product sum of the first and second vectors and a second mode of operation wherein the voltage on the common line coupled to the second plates of the plurality of capacitors represents one of the sequence of weighted binary codes.

The dot-product summation circuitry may comprise an additional plurality of capacitors coupled to a plurality of logical AND gates via a plurality of switches, each of the plurality of logical AND gates receiving as input a first vector element of the first vector and a second vector element of the second vector, the plurality of logical AND gates having respective outputs coupled to first plates of the additional plurality of capacitors.

The dot-product summation circuitry may comprise a plurality of bit cell processing units, each of the plurality of bit cell processing units storing a first vector element value representing one of the elements of the first vector, receiving as input a second vector element value representing one of the elements of the second vector, and outputting a value representing binary multiplication of the first vector element value and the second vector element value. Each of the plurality of bit cell processing units may comprise one of an RPU and a memory cell.

Figure 12:
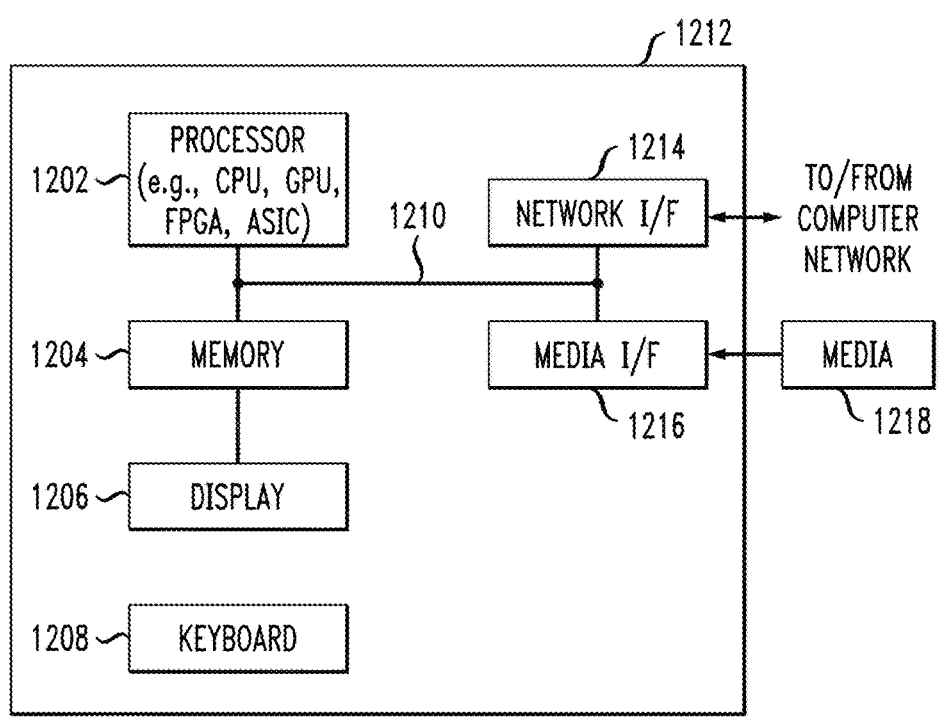
FIG. 12 depicts an exemplary processor system according to an illustrative embodiment.

Additionally, an embodiment of the present invention can make use of software running on a computer or workstation. With reference to FIG. 12, such an implementation might employ, for example, a processor 1202, a memory 1204, and an input/output interface formed, for example, by a display 1206 and a keyboard 1208. The term "processor" as used herein is intended to include any processing device, such as, for example, one that includes a multi-core CPU, GPU, FPGA and/or other forms of processing circuitry such as one or more ASICs. Further, the term "processor" may refer to more than one individual processor. The term "memory" is intended to include memory associated with a processor (e.g., CPU, GPU, FPGA, ASIC, etc.) such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 1202, memory 1204, and input/output interface such as display 1206 and keyboard 1208 can be interconnected, for example, via bus 1210 as part of a data processing unit 1212. Suitable interconnections, for example via bus 1210, can also be provided to a network interface 1214, such as a network card, which can be provided to interface with a computer network, and to a media interface 1216, such as a diskette or CD-ROM drive, which can be provided to interface with media 1218.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1202 coupled directly or indirectly to memory elements 1204 through a system bus 1210. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 1208, displays 1206, pointing devices, and the like) can be coupled to the system either directly (such as via bus 1210) or through intervening I/O controllers (omitted for clarity).

Network adapters such as network interface 1214 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 1212 as shown in FIG. 12) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random-access memory (RAM), a read-only memory (ROM), an erasable programmable read-only memory (EPROM or Flash memory), an SRAM, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 1202. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICs), functional circuitry, an appropriately programmed digital computer with associated memory, and the like. Given the teachings of the invention provided herein, one of ordinary skill in the related art will be able to contemplate other implementations of the components of the invention.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 13:
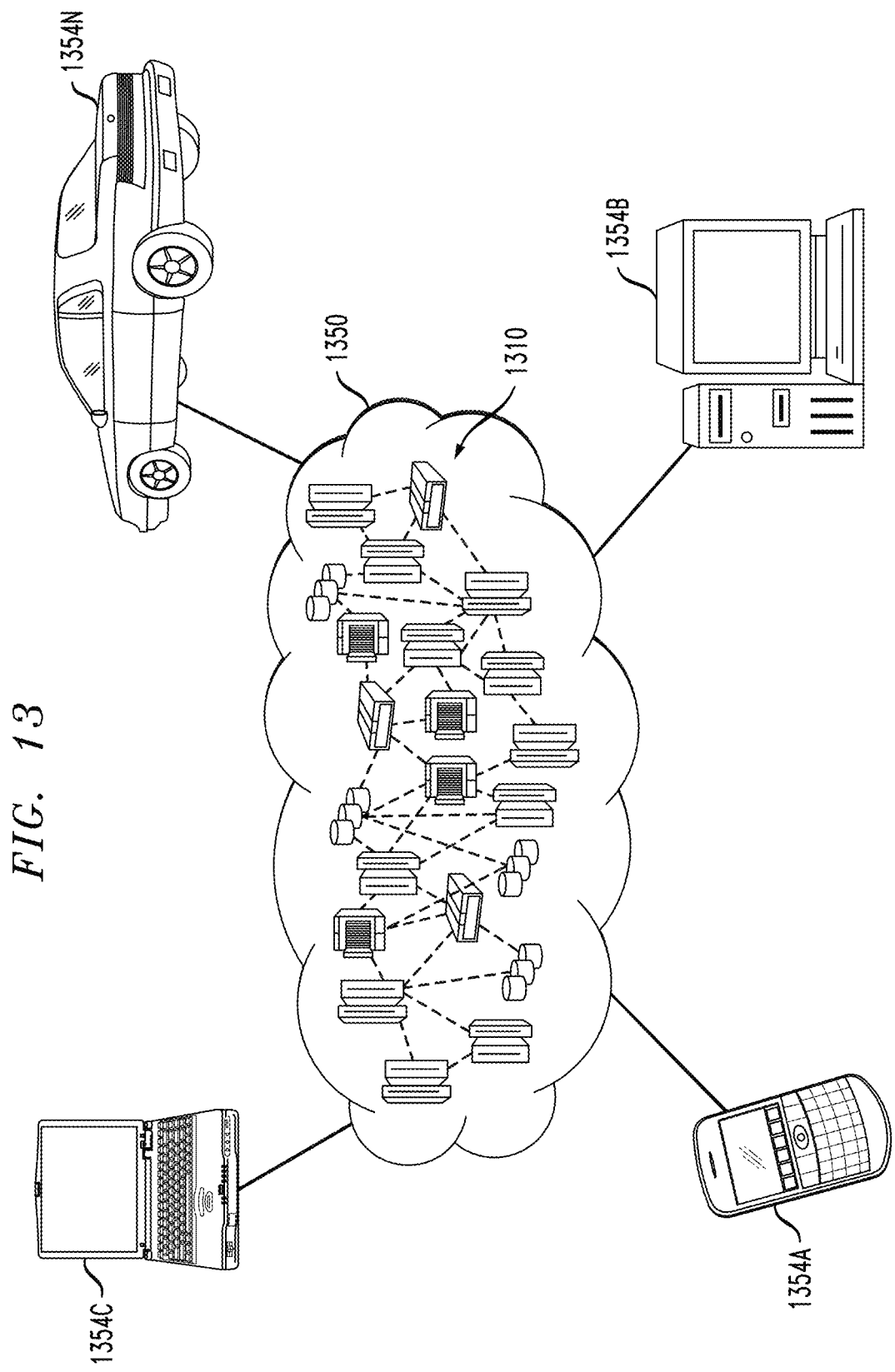
FIG. 13 depicts a cloud computing environment according to an illustrative embodiment.

Referring now to FIG. 13, illustrative cloud computing environment 1350 is depicted. As shown, cloud computing environment 1350 includes one or more cloud computing nodes 1310 with which local computing devices used by cloud consumers, such as, for example, personal digital assistant (PDA) or cellular telephone 1354A, desktop computer 1354B, laptop computer 1354C, and/or automobile computer system 1354N may communicate. Nodes 1310 may communicate with one another. They may be grouped (not shown) physically or virtually, in one or more networks, such as Private, Community, Public, or Hybrid clouds as described hereinabove, or a combination thereof. This allows cloud computing environment 1350 to offer infrastructure, platforms and/or software as services for which a cloud consumer does not need to maintain resources on a local computing device. It is understood that the types of computing devices 1354A-N shown in FIG. 13 are intended to be illustrative only and that computing nodes 1310 and cloud computing environment 1350 can communicate with any type of computerized device over any type of network and/or network addressable connection (e.g., using a web browser).

Figure 14:
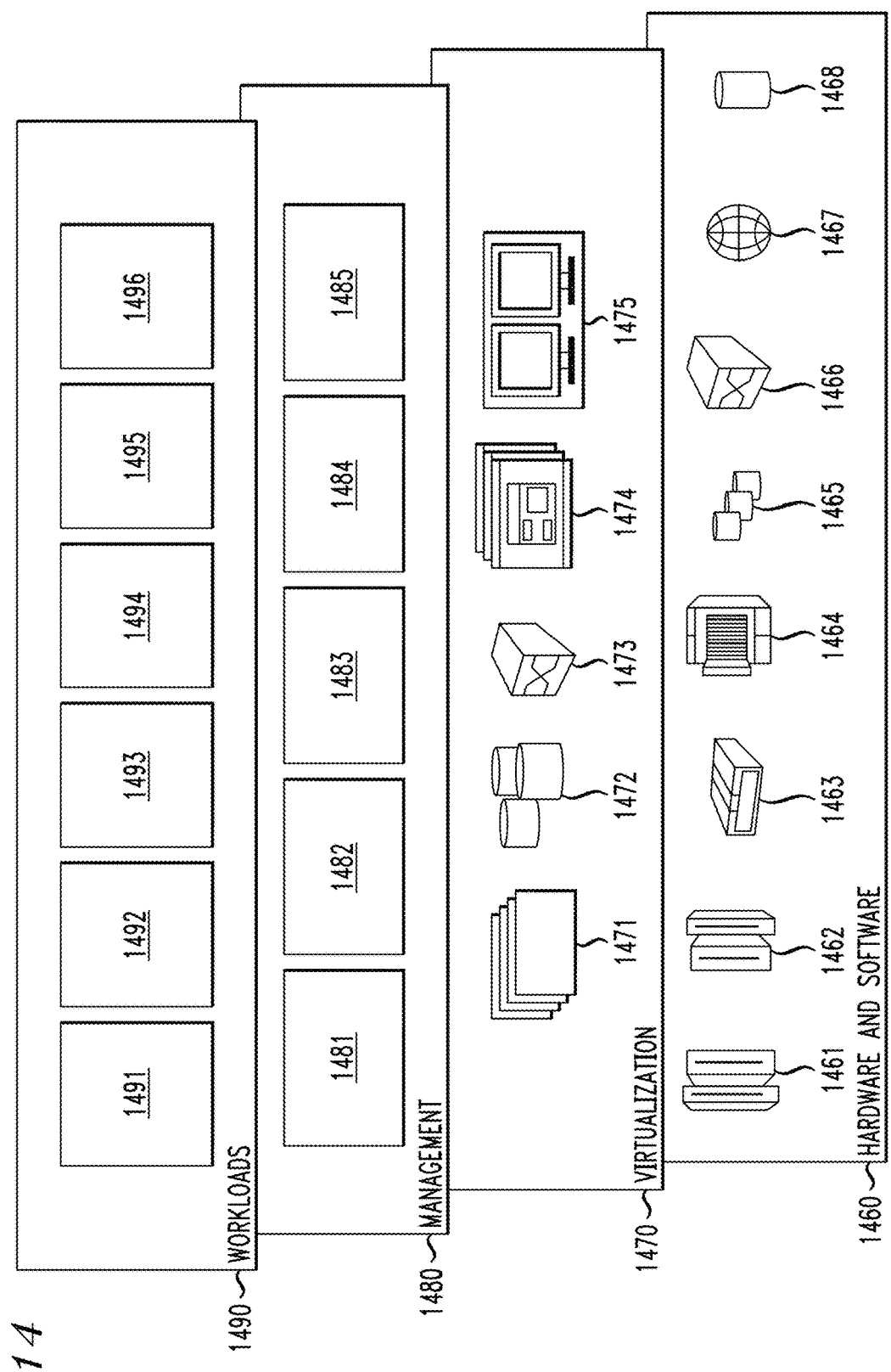
FIG. 14 depicts abstraction model layers according to an illustrative embodiment.

Referring now to FIG. 14, a set of functional abstraction layers provided by cloud computing environment 1350 (FIG. 13) is shown. It should be understood in advance that the components, layers, and functions shown in FIG. 14 are intended to be illustrative only and embodiments of the invention are not limited thereto. As depicted, the following layers and corresponding functions are provided:

Hardware and software layer 1460 includes hardware and software components. Examples of hardware components include: mainframes 1461; RISC (Reduced Instruction Set Computer) architecture-based servers 1462; servers 1463; blade servers 1464; storage devices 1465; and networks and networking components 1466. In some embodiments, software components include network application server software 1467 and database software 1468.

Virtualization layer 1470 provides an abstraction layer from which the following examples of virtual entities may be provided: virtual servers 1471; virtual storage 1472; virtual networks 1473, including virtual private networks; virtual applications and operating systems 1474; and virtual clients 1475.

In one example, management layer 1480 may provide the functions described below. Resource provisioning 1481 provides dynamic procurement of computing resources and other resources that are utilized to perform tasks within the cloud computing environment. Metering and Pricing 1482 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1483 provides access to the cloud computing environment for consumers and system administrators. Service level management 1484 provides cloud computing resource allocation and management such that required service levels are met. Service Level Agreement (SLA) planning and fulfillment 1485 provide pre-arrangement for, and procurement of, cloud computing resources for which a future requirement is anticipated in accordance with an SLA.

Workloads layer 1490 provides examples of functionality for which the cloud computing environment may be utilized. Examples of workloads and functions which may be provided from this layer include: mapping and navigation 1491; software development and lifecycle management 1492; virtual classroom education delivery 1493; data analytics processing 1494; transaction processing 1495; and artificial intelligence algorithm (with energy efficient MS-DPE/MS-MAC computations) processing 1496, in accordance with the one or more embodiments of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    at least one processor; and
    at least one memory including instruction code;
    the at least one memory and the instruction code being configured to, with the at least one processor, cause the apparatus at least to:
    perform an analog-to-digital conversion of an analog input to a digital output comprising a set of bits, the set of bits comprising a most significant bit and one or more additional bits, the analog-to-digital conversion starting at a given one of the one or more additional bits following the most significant bit, wherein performing the analog-to-digital conversion starting at the given one of the one or more additional bits following the most significant bit comprises skipping computing of a designated number of the most significant bits of the set of bits;
    detect one or more designated conditions associated with the digital output produced by the analog-to-digital conversion; and
    responsive to detecting at least one of the one or more designated conditions, restart the analog-to-digital conversion of the analog input to the digital input starting at another one of the bits, the other one of the bits being more significant than the given one of the one or more additional bit.

2. The apparatus of claim 1, wherein the given one of the one or more additional bits following the most significant bit comprises a first one of the one or more additional bits following the most significant bit, and wherein restarting the analog-to-digital conversion starting at the other one of the set of bits comprises restarting the analog-to-digital conversion starting at the most significant bit.

3. The apparatus of claim 1, wherein detecting said at least one of the one or more designated conditions is based at least in part on values of a threshold number of consecutive ones of the one or more additional bits following the given one of the one or more additional bits.

4. The apparatus of claim 3, wherein the threshold number is selected based at least in part on at least one of: an output probability distribution of a dot-product engine performing a binary multiplication of first and second vectors; and a tolerable error in an output of the analog-to-digital conversion.

5. The apparatus of claim 1, wherein the given one of the one or more additional bits following the most significant bit (MSB) comprises an (MSB−k)th bit, wherein restarting the analog-to-digital conversion starting at the other one of the set of bits comprises restarting the analog-to-digital conversion starting at an (MSB−k+l)th bit, and wherein l is an integer greater than or equal to one.

6. The apparatus of claim 5, wherein a value of k is selected based at least in part on at least one of: an output probability distribution of a dot-product engine performing a binary multiplication of first and second vectors; and a tolerable error in an output of the analog-to-digital conversion.

7. A method, comprising the step of:
    performing an analog-to-digital conversion of an analog input to a digital output comprising a set of bits, the set of bits comprising a most significant bit and one or more additional bits, the analog-to-digital conversion starting at a given one of the one or more additional bits following the most significant bit, wherein performing the analog-to-digital conversion starting at the given one of the one or more additional bits following the most significant bit comprises skipping computing of a designated number of the most significant bits of the set of bits;

detecting one or more designated conditions associated with the digital output produced by the analog-to-digital conversion; and responsive to detecting at least one of the one or more designated conditions, restarting the analog-to-digital conversion of the analog input to the digital input starting at another one of the bits, the other one of the bits being more significant than the given one of the one or more additional bits;

wherein the method is executed by processing circuitry configured to execute instruction code.

8. The method of claim 7, wherein the given one of the one or more additional bits following the most significant bit (MSB) comprises an (MSB−k)th bit, wherein restarting the analog-to-digital conversion starting at the other one of the set of bits comprises restarting the analog-to-digital conversion starting at an (MSB−k+l)th bit, and wherein l is an integer greater than or equal to one.

9. An article of manufacture comprising a non-transitory computer-readable storage medium having embodied therein executable instruction code that when executed by a processor causes the processor to perform the step of:

performing an analog-to-digital conversion of an analog input to a digital output comprising a set of bits, the set of bits comprising a most significant bit and one or more additional bits, the analog-to-digital conversion starting at a given one of the one or more additional bits following the most significant bit, wherein performing the analog-to-digital conversion starting at the given one of the one or more additional bits following the most significant bit comprises skipping computing of a designated number of the most significant bits of the set of bits;

detecting one or more designated conditions associated with the digital output produced by the analog-to-digital conversion; and responsive to detecting at least one of the one or more designated conditions, restarting the analog-to-digital conversion of the analog input to the digital input starting at another one of the bits, the other one of the bits being more significant than the given one of the one or more additional bits.

10. The article of claim 9, wherein the given one of the one or more additional bits following the most significant bit (MSB) comprises an (MSB−k)th bit, wherein restarting the analog-to-digital conversion starting at the other one of the set of bits comprises restarting the analog-to-digital conversion starting at an (MSB−k+l)th bit, and wherein l is an integer greater than or equal to one.

11. A system comprising:

a dot-product summation computation unit configured to perform binary multiplication of first and second vectors;

a successive approximation register analog-to-digital converter unit configured to convert an analog output of the dot-product summation computation unit to a digital output comprising a set of bits, the set of bits comprising a most significant bit and one or more additional bits; and controller logic operatively coupled to the successive approximation register analog-to-digital converter unit, the controller logic being configured to determine values of the set of bits of the digital output based at least in part on a comparison of an output of the dot-product summation computation unit and a sequence of weighted binary codes;

wherein the sequence of weighted binary codes starts from a given one of the one or more additional bits following the most significant bit;

to detect one or more designated conditions associated with the determined values of the set of bits of the digital output; and responsive to detecting at least one of the one or more designated conditions, to restart determination of the values of the set of bits of the digital output with a new sequence of weighted binary codes starting from another one of the bits.

12. The system of claim 11, wherein the given one of the one or more additional bits following the most significant bit (MSB) comprises an (MSB−k)th bit, wherein the new sequence of weighted binary codes starts from an (MSB−k+l)th bit, and wherein l is an integer greater than or equal to one.

13. The system of claim 11, wherein the system is implemented as part of an artificial intelligence system.

14. The system of claim 11, wherein the system is implemented as part of one or more integrated circuits.

15. A device comprising:

dot-product summation circuitry configured to output a first signal, the first signal comprising a dot-product sum of binary multiplication of first and second vectors; and a successive approximation register analog-to-digital converter configured to perform conversion of the first signal output by the dot-product summation circuitry to a digital output comprising a set of bits, the set of bits comprising a most significant bit and one or more additional bits;

wherein the successive approximation register analog-to-digital converter comprises:

successive approximation register controller circuitry configured to output a second signal; and comparator circuitry comprising a first input node coupled to the dot-product summation circuitry, a second input node coupled to the successive approximation register controller circuitry, and an output node configured to provide an output value based at least in part on a comparison of the first value output by the dot-product summation circuitry and the second value output by the successive approximation register controller circuitry;

wherein the successive approximation register controller circuitry is configured to determine values of the set of bits of the digital output based at least in part on output values of the comparator circuitry produced as a sequence of weighted binary codes is output as the second signal, wherein the sequence of weighted binary codes starts from a given one of the one or more additional bits following the most significant bit;

to detect one or more designated conditions associated with the determined values of the set of bits of the digital output; and responsive to detecting at least one of the one or more designated conditions, to restart determination of the values of the set of bits of the digital output with a new sequence of weighted binary codes starting from another one of the bits.

16. The device of claim 15, wherein the given one of the one or more additional bits following the most significant bit (MSB) comprises an (MSB−k)th bit, and wherein the new sequence of weighted binary codes starts from an (MSB−k+l)th bit, and wherein l is an integer greater than or equal to one.

17. The device of claim 15, wherein the successive approximation register controller circuitry is coupled to the comparator circuitry via a plurality of capacitors.

18. The device of claim 17, wherein the plurality of capacitors have respective different capacitance values.

19. The device of claim 17, wherein the dot-product summation circuitry comprises a plurality of logical AND gates each receiving as input a first vector element of the first vector and a second vector element of the second vector, the plurality of logical AND gates having respective outputs coupled to first plates of the plurality of capacitors.

20. The device of claim 17, wherein each of the plurality of capacitors has a same capacitance value.

21. The device of claim 20, wherein a plurality of switches are coupled between respective ones of the plurality of logical AND gates and the plurality of capacitors, the plurality of switches being configured to switch between a first mode of operation wherein a voltage on a common line coupled to second plates of the plurality of capacitors represents the dot-product sum of the first and second vectors and a second mode of operation wherein the voltage on the common line coupled to the second plates of the plurality of capacitors represents one of the sequence of weighted binary codes.

22. The device of claim 17, wherein the dot-product summation circuitry comprises an additional plurality of capacitors coupled to a plurality of logical AND gates via a plurality of switches, each of the plurality of logical AND gates receiving as input a first vector element of the first vector and a second vector element of the second vector, the plurality of logical AND gates having respective outputs coupled to first plates of the additional plurality of capacitors.

23. The device of claim 15, wherein the dot-product summation circuitry comprises a plurality of bit cell processing units, each of the plurality of bit cell processing units:

storing a first vector element value representing one of the elements of the first vector;

receiving as input a second vector element value representing one of the elements of the second vector; and outputting a value representing binary multiplication of the first vector element value and the second vector element value.

24. The device of claim 23, wherein each of the plurality of bit cell processing units comprises one of a resistive processing unit and a memory cell.

* * * * *